(12) United States Patent
Huang et al.

(10) Patent No.: US 11,846,856 B2
(45) Date of Patent: Dec. 19, 2023

(54) ARRAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Jianhua Huang, Beijing (CN); Zhihua Sun, Beijing (CN); Yingying Qu, Beijing (CN); Ting Dong, Beijing (CN); Yifu Chen, Beijing (CN); Lingdan Bo, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 434 days.

(21) Appl. No.: 17/264,498

(22) PCT Filed: Mar. 17, 2020

(86) PCT No.: PCT/CN2020/079627
§ 371 (c)(1),
(2) Date: Jan. 29, 2021

(87) PCT Pub. No.: WO2021/184186
PCT Pub. Date: Sep. 23, 2021

(65) Prior Publication Data
US 2023/0168552 A1 Jun. 1, 2023

(51) Int. Cl.
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *G02F 1/136209* (2013.01); *H01L 27/124* (2013.01)

(58) Field of Classification Search
CPC ......... G02F 1/136286; G02F 1/136209; G02F 1/1368; G02F 1/134372; H01L 27/124
See application file for complete search history.

(56) References Cited

U.S. PATENT DOCUMENTS

2018/0047752 A1 2/2018 Du
2018/0226433 A1* 8/2018 Honda ................. G02F 1/1368
(Continued)

FOREIGN PATENT DOCUMENTS

| CN | 106154667 A | 11/2016 |
| CN | 110780500 A | 2/2020 |
| KR | 20100068636 A | 6/2010 |

OTHER PUBLICATIONS

PCT International Search Report for corresponding PCT Application No. PCT/CN2020/079627, 10 pages.

*Primary Examiner* — James A Dudek
(74) *Attorney, Agent, or Firm* — Dority & Manning, P.A.

(57) ABSTRACT

An array substrate has a plurality of sub-pixel regions. The array substrate includes a base substrate, gate lines disposed on a side of the base substrate and extending in a first direction, pixel electrodes each disposed in a respective one of the sub-pixel regions, and common electrodes disposed on a side, facing away from the base substrate, of the pixel electrodes and the gate lines. An orthographic projection of at least one common electrode on the base substrate at least partially overlaps with an orthographic projection of at least one gate line adjacent to the at least one common electrode on the base substrate, or a border of an orthographic projection of at least one common electrode on the base substrate partially overlaps with a border of an orthographic projection of at least one gate line adjacent to the at least one common electrode on the base substrate.

16 Claims, 10 Drawing Sheets

(56) References Cited

U.S. PATENT DOCUMENTS

| | | | |
|---|---|---|---|
| 2018/0323224 A1* | 11/2018 | Hung | .................... H01L 27/124 |
| 2019/0013333 A1* | 1/2019 | Inoue | .................. H01L 27/1259 |
| 2019/0050100 A1* | 2/2019 | Ma | ........................ G06F 3/0412 |
| 2019/0064607 A1 | 2/2019 | Cheng et al. | |

* cited by examiner (a)  (b)

(a) (b)

ARRAY SUBSTRATE AND DISPLAY DEVICE

CROSS-REFERENCE TO RELATED APPLICATION

This application is a national phase entry under 35 USC 371 of International Patent Application No. PCT/CN2020/079627 filed on Mar. 17, 2020, which is incorporated herein by reference in its entirety.

TECHNICAL FIELD

The present disclosure relates to the field of display technologies, and in particular, to an array substrate and a display device.

BACKGROUND

Liquid crystal display (LCD) devices are widely used due to their advantages such as low power consumption, miniaturization, lightness and thinness.

SUMMARY

In one aspect, an array substrate having a plurality of sub-pixel regions is provided. The array substrate includes: a base substrate, a plurality of gate lines disposed on a side of the base substrate and extending in a first direction, a plurality of pixel electrodes, each of the plurality of pixel electrodes being disposed in a respective one of the plurality of sub-pixel regions, and a plurality of common electrodes disposed on a side, facing away from the base substrate, of the plurality of pixel electrodes and the plurality of gate lines. An orthographic projection of at least one common electrode on the base substrate at least partially overlaps with an orthographic projection of at least one gate line adjacent to the at least one common electrode on the base substrate, or a border of an orthographic projection of at least one common electrode on the base substrate partially overlaps with a border of an orthographic projection of at least one gate line adjacent to the at least one common electrode on the base substrate.

In some embodiments, at least one gate line is provided at each of opposite ends of each common electrode. The orthographic projection of the at least one common electrode on the base substrate at least partially overlaps with orthographic projections of gate lines adjacent to opposite ends of the at least one common electrode on the base substrate, or the border of the orthographic projection of the at least one common electrode on the base substrate partially overlaps with borders of orthographic projections of gate lines adjacent to opposite ends of the at least one common electrode on the base substrate.

In some embodiments, in a direction perpendicular to the first direction, a ratio of a dimension of each overlapping region to a dimension of a gate line forming the overlapping region is in a range from 1:3 to 1:1. The overlapping region is a region where the orthographic projection of the at least one common electrode on the base substrate and an orthographic projection of the gate line adjacent to the at least one common electrode on the base substrate overlap.

In some embodiments, in a direction perpendicular to the first direction, dimensions of overlapping regions of the orthographic projection of the at least one common electrode on the base substrate and the orthographic projections of the gate lines adjacent to the opposite ends of the at least one common electrode on the base substrate are same.

In some embodiments, the array substrate further includes a plurality of data lines disposed on the side of the base substrate and extending in a second direction, and the plurality of data lines and the plurality of gate lines cross and are insulated from each other. In the first direction, a ratio of a distance between the orthographic projection of the at least one common electrode on the base substrate and an orthographic projection of at least one data line adjacent to the at least one common electrode on the base substrate to a dimension of the at least one data line is in a range from 3:10 to 1:1.

In some embodiments, in the first direction, a ratio of a distance between an orthographic projection of at least one pixel electrode on the base substrate and an orthographic projection of at least one data line adjacent to the at least one pixel electrode on the base substrate to a dimension of the at least one data line is in a range from 3:10 to 1:1.

In some embodiments, in the first direction, the distance between the orthographic projection of the at least one pixel electrode on the base substrate and the orthographic projection of the at least one data line adjacent to the at least one pixel electrode on the base substrate is greater than the distance between the orthographic projection of the at least one common electrode on the base substrate and the orthographic projection of the at least one data line adjacent to the at least one common electrode on the base substrate.

In some embodiments, the array substrate further includes a plurality of connecting portions disposed in a same layer as the plurality of common electrodes, and each connecting portion and two common electrodes adjacent to the connecting portion are an integral structure.

In some embodiments, the plurality of common electrodes are arranged in a plurality of columns in the first direction. In at least one column of common electrodes, every two adjacent common electrodes and a connecting portion therebetween are an integral structure.

In some embodiments, the array substrate further includes a plurality of common electrode lines extending in the first direction and disposed in a same layer as the plurality of gate lines. The plurality of common electrodes are arranged in a plurality of rows in the second direction. Each common electrode line is electrically connected to a plurality of common electrodes in a row through a plurality of via holes.

In some embodiments, the array substrate further includes a thin film transistor disposed on a side of each pixel electrode facing the base substrate. The thin film transistor includes a gate electrode, a source electrode and a drain electrode. The gate electrode and a gate line adjacent to the gate electrode are disposed in a same layer and electrically connected to each other. The pixel electrode is electrically connected to the source electrode or the drain electrode. The array substrate further includes a plurality of data lines, the source electrode, the drain electrode and the plurality of data lines are disposed in a same layer.

In some embodiments, the array substrate further includes a thin film transistor disposed in each sub-pixel region and located between a pixel electrode and a common electrode in the sub-pixel region. The thin film transistor includes a gate electrode, a source electrode and a drain electrode. The gate electrode and a gate line adjacent to the gate electrode are disposed in a same layer and electrically connected to each other. The pixel electrode is electrically connected to the source electrode or the drain electrode. The array substrate further includes a plurality of data lines, the plurality of data lines, the source electrode and the drain electrode are disposed in a same layer.

In some embodiments, the array substrate further includes a plurality of conductive patterns disposed in a same layer as the plurality of common electrodes, each of the conductive patterns is disposed in a respective one of the plurality of sub-pixel regions. Each conductive pattern is electrically connected to a source electrode or a drain electrode of a thin film transistor in a same sub-pixel region as the conductive pattern, and is electrically connected to a pixel electrode in the same sub-pixel region as the conductive pattern.

In some embodiments, each common electrode has a plurality of slits, and an extending direction of at least a part of the plurality of slits is parallel to or at an acute angle to the first direction.

In some embodiments, each sub-pixel region includes a first sub-region and a second sub-region that are adjacent to each other. Among the plurality of slits, slits located in the first sub-region extend in a third direction, and slits located in the second sub-region extend in a fourth direction. The third direction and the fourth direction are symmetrical with respect to the first direction.

In another aspect, a display device is provided. The display device includes: the array substrate as described in some embodiments described above, an opposite substrate disposed opposite to the array substrate, and a liquid crystal layer disposed between the array substrate and the opposite substrate.

In some embodiments, the opposite substrate includes an opposite base substrate, and a black matrix disposed on a side of the opposite base substrate facing the array substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products involved in the embodiments of the present disclosure.

DETAILED DESCRIPTION

Figure 1:
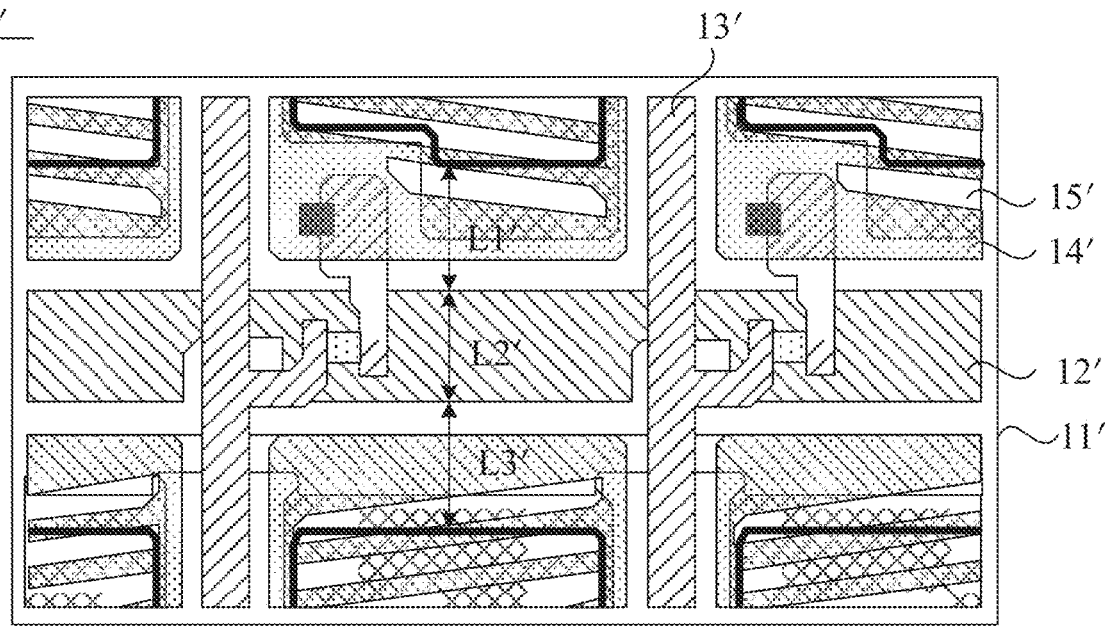
FIG. 1 is a structural diagram of an array substrate in the related art.

Technical solutions in some embodiments of the present disclosure will be described clearly and completely below with reference to the drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed as an open and inclusive meaning, i.e., "include, but not limited to". In the description of the specification, the terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any or more embodiments or examples in any suitable manner. Schematic representations of the above terms do not necessarily refer to the same embodiment(s) or example(s). In addition, the specific features, structures, materials or characteristics may be included in any or more embodiments or examples in any suitable manner.

Hereinafter, the terms such as "first" and "second" are only used for descriptive purposes, and are not to be construed as indicating or implying a relative importance or implicitly indicating the number of indicated technical features below. Thus, features defined by "first" and "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. The embodiments disclosed herein are not necessarily limited to the contents herein.

In the related art, a liquid crystal display device generally includes an array substrate and an opposite substrate that are disposed opposite to each other, and a liquid crystal layer disposed between the array substrate and the opposite substrate. The array substrate is able to drive liquid crystal molecules in the liquid crystal layer to deflect, so that the liquid crystal display device is able to display an image required to be displayed.

As shown in FIG. 1, an array substrate 100' generally includes a base substrate 11', a common electrode 15' disposed on a side of the base substrate 11', and a pixel electrode 14' disposed on a side of the common electrode 15' away from the base substrate 11'. The array substrate 100' further includes a plurality of gate lines 12' and a plurality of data lines 13' that are disposed on the side of the base substrate 11'.

Figure 2:
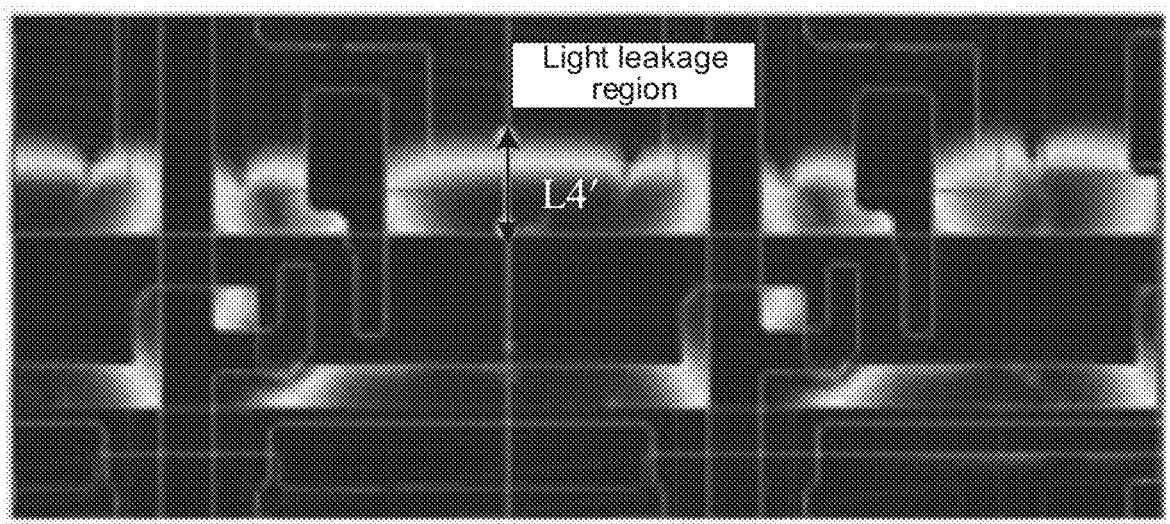
FIG. 2 is a schematic diagram of light leakage regions between a gate line and a common electrode adjacent to the gate line and between the gate line and a pixel electrode adjacent to the gate line when a liquid crystal display device in the related art is in a dark state.
Figure 4:
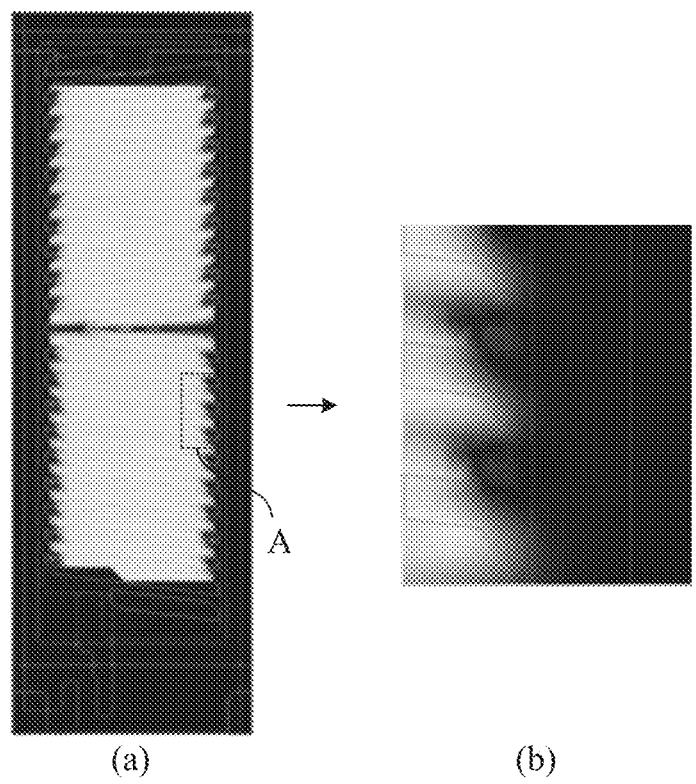
FIG. 4 is a schematic diagram of a dark field region at an edge of a sub-pixel region when a liquid crystal display device in the related art is in a bright state.

Part (a) of FIG. 4 is a schematic diagram of a dark field region at an edge of a sub-pixel region when the above liquid crystal display device is in a bright state, and part (b) of FIG. 4 is an enlarged view of the local region A in part (a) of FIG. 4. During a display process of the liquid crystal display device, in a case where a display state is the bright state, as shown in FIG. 4, a dark field region (i.e., the black triangular region in part (b) of FIG. 4) at an edge (i.e., a region between a data line 13' and a pixel electrode 14' or a common electrode 15 adjacent to the data line 13') of each sub-pixel region is large, and a transmittance of each sub-pixel region is low; in a case where the display state is a dark state, as shown in FIG. 2, a light leakage region (i.e., the white region shown in FIG. 2) between a gate line 12' and a pixel electrode 14' or a common electrode 15' adjacent to the gate line 12' is large, so that a size of a black matrix in the liquid crystal display device is large and an aperture ratio of the liquid crystal display device is low.

Figure 5:
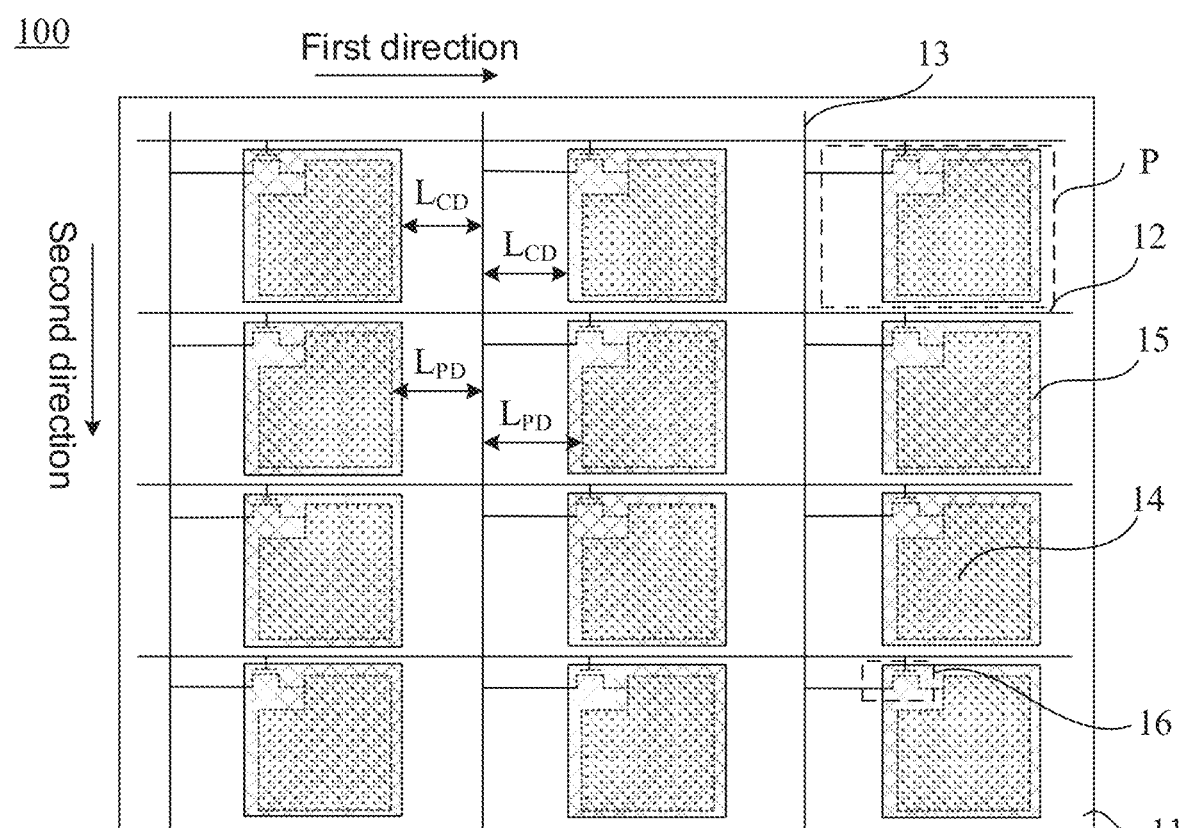
FIG. 5 is a structural diagram of an array substrate, in accordance with some embodiments of the present disclosure.
Figure 6:
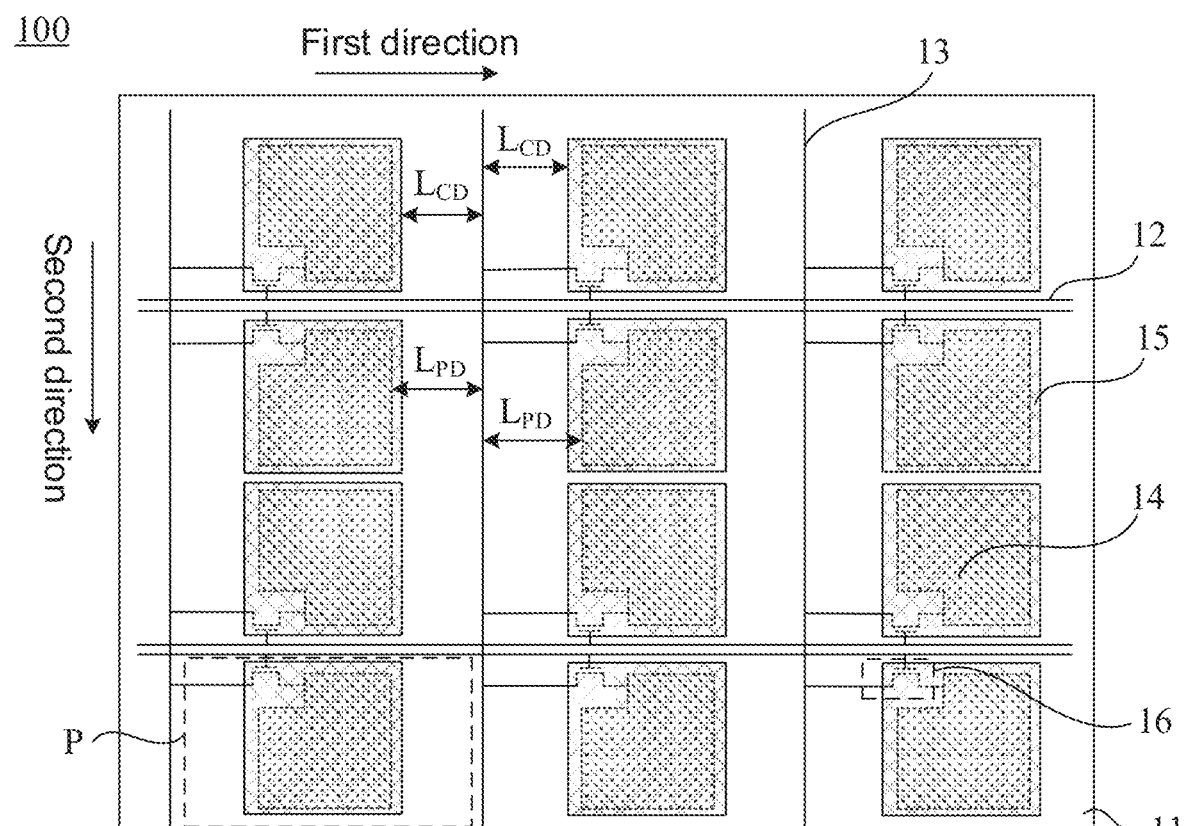
FIG. 6 is a structural diagram of another array substrate, in accordance with some embodiments of the present disclosure.

On this basis, some embodiments of the present disclosure provide an array substrate 100. As shown in FIGS. 5 and 6, the array substrate 100 has a plurality of sub-pixel regions P. The plurality of sub-pixel regions P may be arranged in an array.

In some embodiments, as shown in FIGS. 5 to 9, the array substrate 100 includes a base substrate 11, a plurality of gate lines 12, a plurality of data lines 13, a plurality of pixel electrodes 14 and a plurality of common electrodes 15.

In some examples, the base substrate 11 may be a rigid base substrate, such as a glass base substrate.

In some examples, as shown in FIGS. 5 and 6, the plurality of gate lines 12 and the plurality of data lines 13 are disposed on a side of the base substrate 11. The plurality of gate lines 12 extend in a first direction, and the plurality of data lines 13 extend in a second direction.

In addition, the plurality of gate lines 12 and the plurality of data lines 13 cross and are insulated from each other. This means that an extending direction of the plurality of gate lines 12 and an extending direction of the plurality of data lines 13 have an included angle therebetween, for example, the first direction is perpendicular to the second direction, the plurality of gate lines 12 and the plurality of data lines 13 are located in different layers, and an insulating medium (e.g., insulating resin) is provided therebetween.

Figure 7:
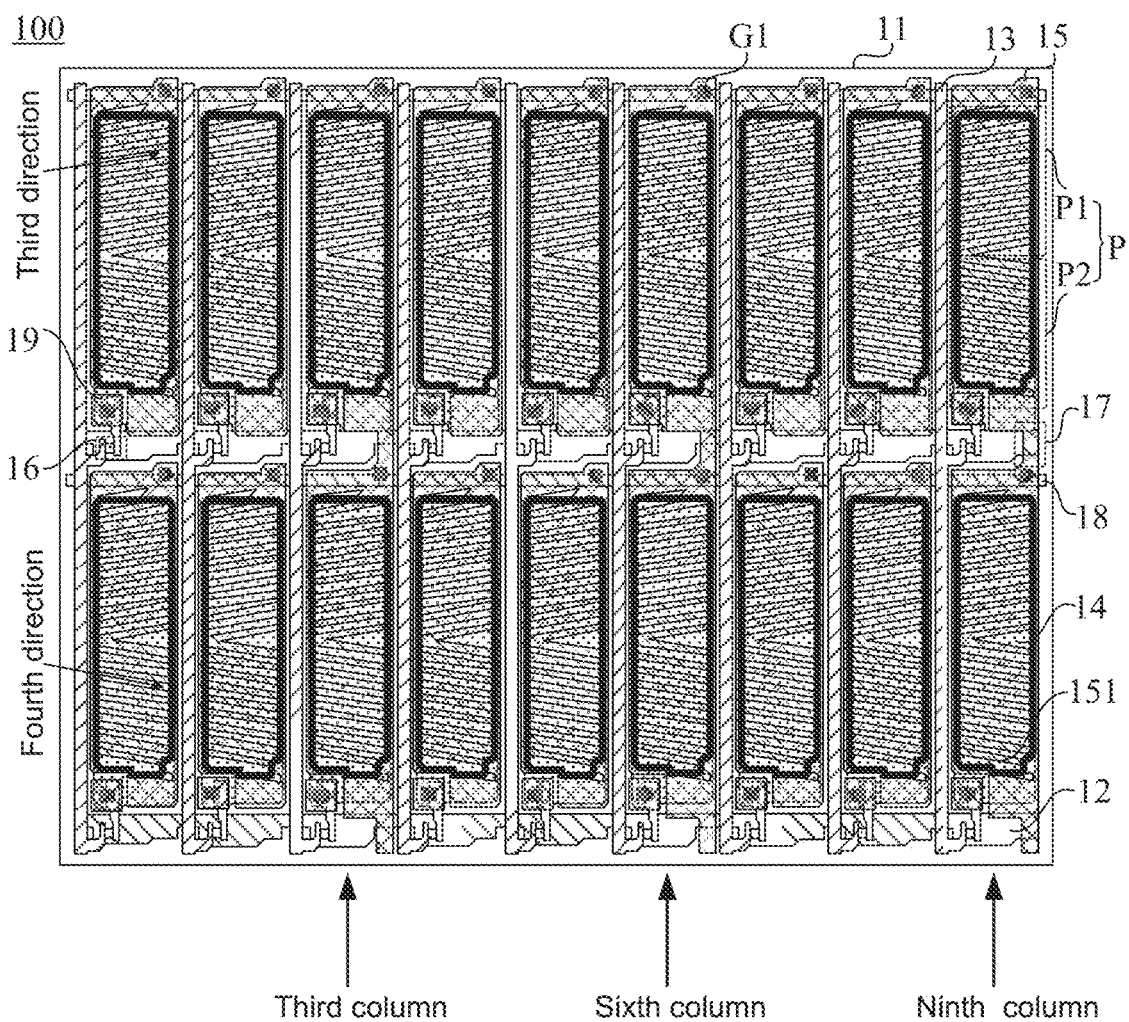
FIG. 7 is a structural diagram of yet another array substrate, in accordance with some embodiments of the present disclosure.
Figure 13:
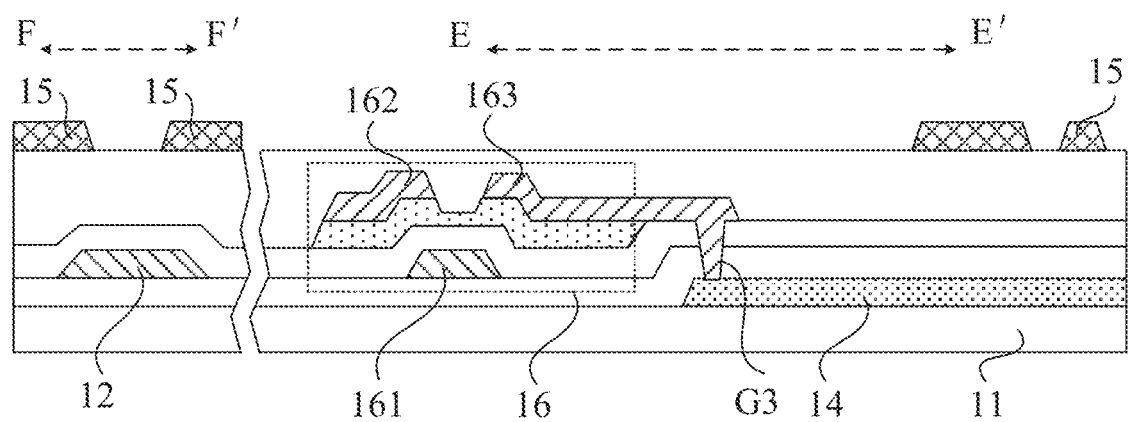
FIG. 13 is a sectional view of the structure shown in FIG. 9 along the E-E' direction and the F-F' direction.
Figure 14:
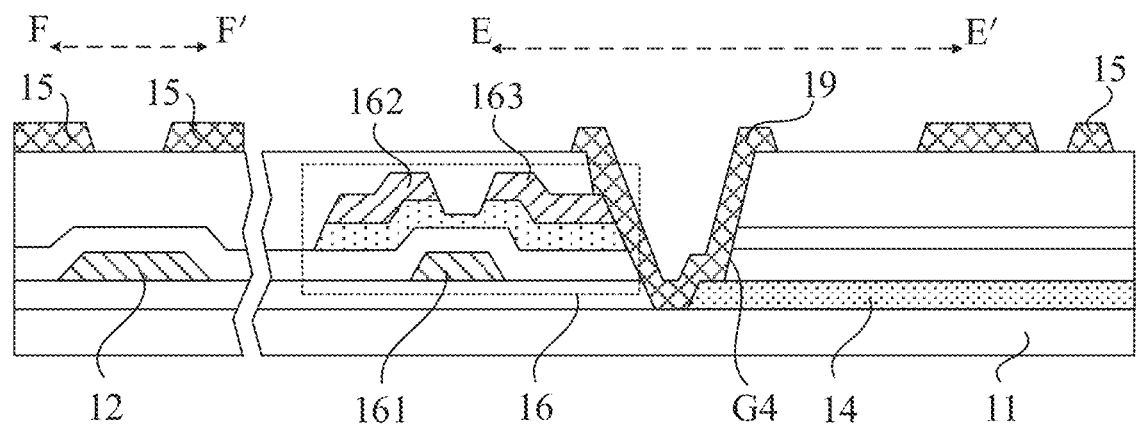
FIG. 14 is another sectional view of the structure shown in FIG. 9 along the E-E' direction and the F-F' direction.
Figure 15:
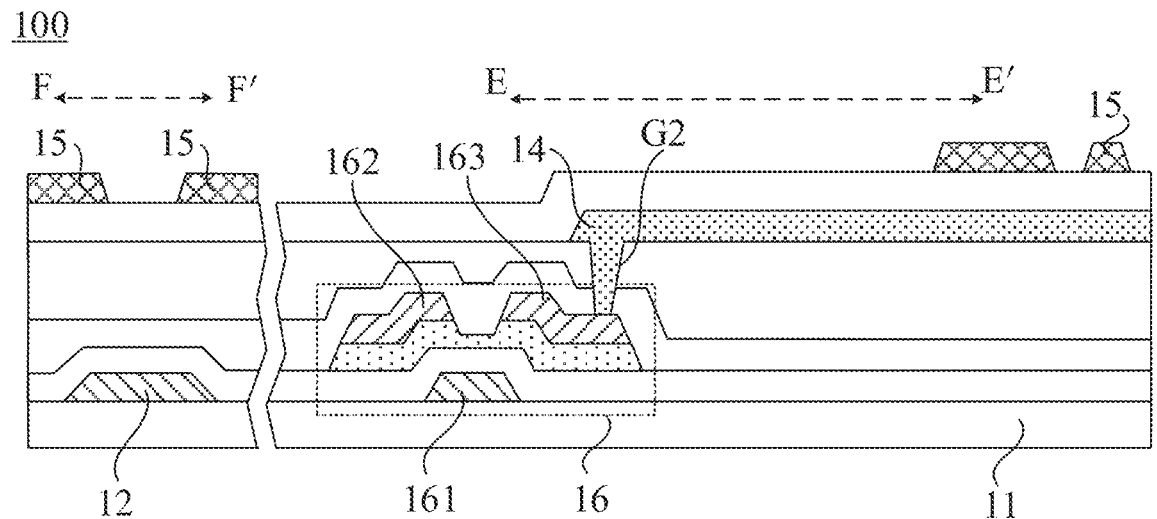
FIG. 15 is yet another sectional view of the structure shown in FIG. 9 along the E-E' direction and the F-F' direction.

In some examples, as shown in FIGS. 5 to 7, the array substrate 100 further includes a thin film transistor 16 disposed in each sub-pixel region P. As shown in FIGS. 13 to 15, the thin film transistor 16 includes a gate electrode 161, a source electrode 162 and a drain electrode 163.

The plurality of gate lines 12 and the plurality of data lines 13 may define the plurality of sub-pixel regions P. This means that the thin film transistor 16 in each sub-pixel region P is adjacent to at least one gate line 12 and adjacent to at least one data line 13. Here, the numbers of gate lines 12 and data lines 13 which are both adjacent to the thin film transistor 16 in each sub-pixel region P are related to an arrangement structure of the array substrate 100.

For example, as shown in FIGS. 5 and 7, each gate line 12 is alternately arranged with thin film transistors 16 in each row of sub-pixel regions P, and each data line 13 is alternately arranged with thin film transistors 16 in each column of sub-pixel regions P. In this case, the thin film transistor 16 in each sub-pixel region P is adjacent to two gate lines 12 and adjacent to two data lines 13.

For example, as shown in FIG. 6, the thin film transistor 16 in each sub-pixel region P is adjacent to one gate line 12 and adjacent to two data lines 13.

The arrangement structure of the array substrate 100 shown in FIGS. 5 to 7 is an arrangement structure in which the thin film transistor 16 is a single-gate transistor as an example. Of course, the arrangement structure of the array substrate 100 provided by the embodiments of the present disclosure may also be an arrangement structure in which the thin film transistor 16 is a double-gate transistor, which will not be repeated herein.

In some examples, as shown in FIGS. 7 and 13 to 15, the gate electrode 161 is disposed in a same layer as and electrically connected to a gate line 12 adjacent to the thin film transistor 16; the source electrode 162, the drain electrode 163 and the plurality of data lines 13 are disposed in a same layer, and the source electrode 162 or the drain electrode 163 is electrically connected to a data line 13 adjacent to the thin film transistor 16.

Here, a positional relationship between the data line 13 and the gate line 12 is the same as a positional relationship between the source electrode 162 or the drain electrode 163 and the gate electrode 161. For example, as shown in FIGS. 13 to 15, the source electrode 162 or the drain electrode 163 is located on a side of the gate electrode 161 away from the base substrate 11, and in this case, the data line 13 is located on a side of the gate line 12 away from the base substrate 11.

It will be noted that the "same layer" mentioned herein refers to a layer structure formed by using a same film forming process to form a film for forming specific patterns, and then using a same mask plate through a single patterning process. According to different specific patterns, the single patterning process may include multiple exposure, developing or etching processes, the specific patterns in the formed layer structure may be continuous or discontinuous, and the specific patterns may be at different heights or have different thicknesses. In this way, the source electrode 162 and the drain electrode 163 may be manufactured simultaneously, which is beneficial to simplifying a manufacturing process of the array substrate 100.

In some examples, a structure of the thin film transistor 16 includes various types. For example, the structure of the thin film transistor 16 is a top gate structure, or as shown in FIGS. 13 to 15, the structure of the thin film transistor 16 is a bottom gate structure. The structure of the thin film transistor 16 in each sub-pixel region P may be the same or different, and may be selectively set according to actual needs.

In some examples, the plurality of pixel electrodes 14 are respectively disposed in the plurality of sub-pixel regions P. For example, as shown in FIGS. 5 and 6, each sub-pixel region P is provided with one pixel electrode 14 therein.

The pixel electrode 14 is electrically connected to the source electrode 162 or the drain electrode 163 of the thin film transistor 16. That is, in a case where a data line 13 adjacent to the thin film transistor 16 is electrically connected to the source electrode 162, the pixel electrode 14 is electrically connected to the drain electrode 163; in a case where the data line 13 adjacent to the thin film transistor 16 is electrically connected to the drain electrode 163, the pixel electrode 14 is electrically connected to the source electrode 162. Therefore, in a case where the thin film transistor 16 is turned on, a data voltage on the data line 13 may be transmitted to the pixel electrode 14 through the thin film transistor 16, so that a pixel voltage on the pixel electrode 14 changes with a change of the data voltage, and the pixel electrode 14 and the data line 13 have substantially no voltage difference therebetween.

Here, in embodiments of the present disclosure, a structure of the array substrate 100 is schematically illustrated by taking an example in which the data line 13 is electrically connected to the source electrode 162 and the pixel electrode 14 is electrically connected to the drain electrode 163.

In some examples, as shown in FIGS. 13 to 15, the plurality of common electrodes 15 are disposed on a side, away from the base substrate 11, of the plurality of pixel electrodes 14 and the plurality of gate lines 12. Among the plurality of common electrodes 15, at least a part of each common electrode 15 is located in one sub-pixel region P. For example, as shown in FIGS. 5 and 6, each common electrode 15 is located in one sub-pixel region P. Or as shown in FIGS. 8 and 9, a part of each common electrode 15 is located in one sub-pixel region P.

Figure 3:
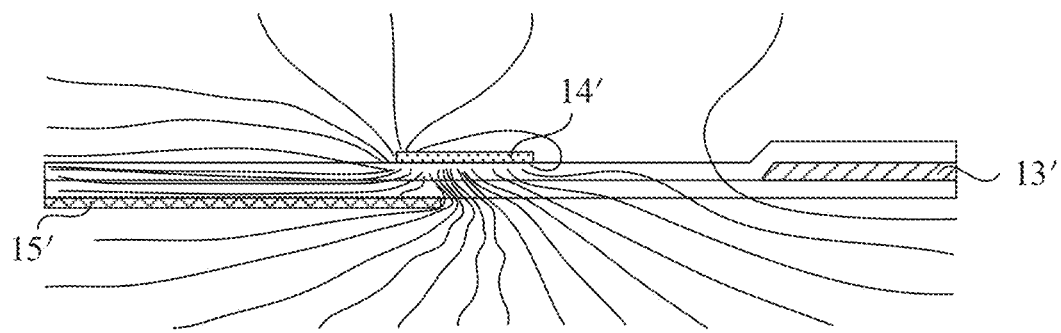
FIG. 3 is a diagram showing electric field distribution between a data line and a common electrode adjacent to the data line and between the data line and a pixel electrode adjacent to the data line when a liquid crystal display device in the related art is in a bright state.
Figure 11:
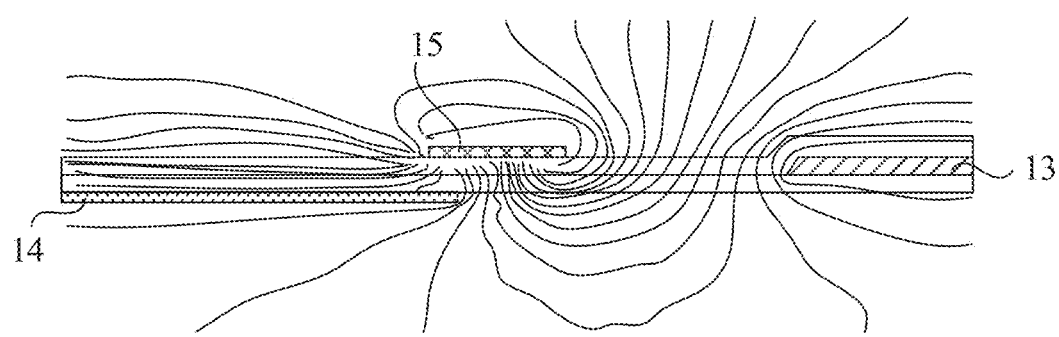
FIG. 11 is a diagram showing electric field distribution between a data line and a common electrode adjacent to the data line and between the data line and a pixel electrode adjacent to the data linein a case where the structure shown in FIG. 9 is applied into a display device being in a bright state.

In some examples, a common voltage transmitted to each common electrode 15 is a constant voltage, which is different from the data voltage. As shown in FIG. 11, in the case where the thin film transistor 16 is turned on, an electric field will be generated between the common electrode 15 and the pixel electrode 14 in each sub-pixel region P, and an electric field will be also generated between the common electrode 15 and the data line 13 adjacent to the common electrode 15. In this way, compared with a case where the pixel electrode 14' is disposed on a side of the common electrode 15' away from the base substrate 11' (as shown in FIG. 3, the pixel electrode 14' and the data line 13' have no voltage difference therebetween, and substantially no electric field is generated), an area of an effective electric field in each sub-pixel region P may be effectively increased. It will be noted that the curves shown in FIGS. 3 and 11 represent electric field lines.

Figure 12:
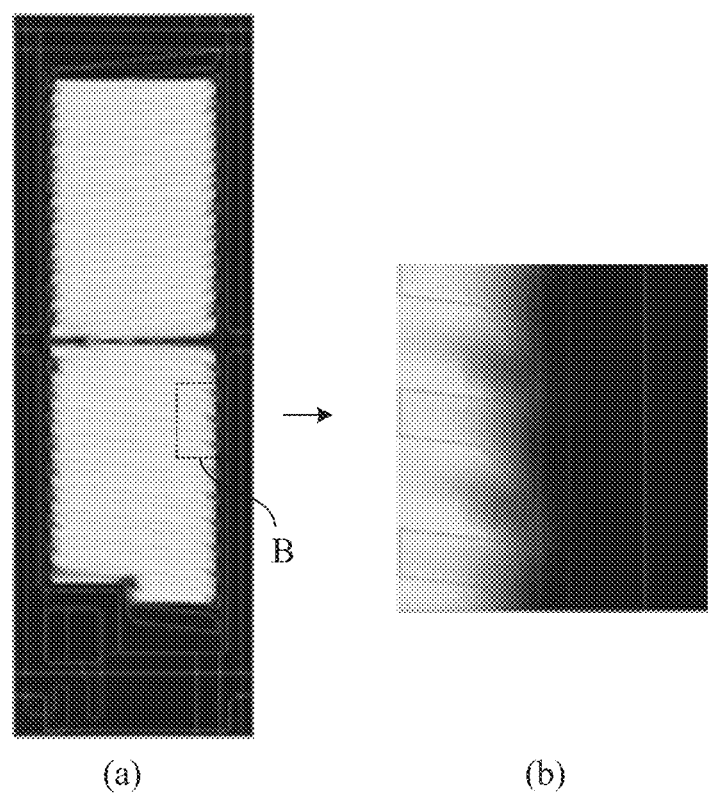
FIG. 12 is a schematic diagram of a dark field region at an edge of a sub-pixel region in a case where the structure shown in FIG. 9 is applied into a display device being in a bright state.

Part (a) of FIG. 12 is a schematic diagram of a dark field region at an edge of a sub-pixel region in a case where the array substrate 100 is applied into a liquid crystal display device and the liquid crystal display device is in a bright state, and part (b) of FIG. 12 is an enlarged view of the local region B in part (a) of FIG. 12. As will be seen by comparing FIGS. 4 and 12, in a case where the array substrate 100 is applied into the liquid crystal display device in embodiments of the present disclosure, the electric field generated between the common electrode 15 and the data line 13 adjacent to the common electrode 15 may effectively improve a rotation state of liquid crystal molecules corresponding to this electric field, so that more light may be transmitted at the edge of the sub-pixel region P, an area of the dark field region (i.e., the black triangular region in part (b) of FIG. 12) is reduced, and a transmittance of the liquid crystal display device is increased. It has been verified that the transmittance of the liquid crystal display device may be increased by 10% or more.

Figure 8:
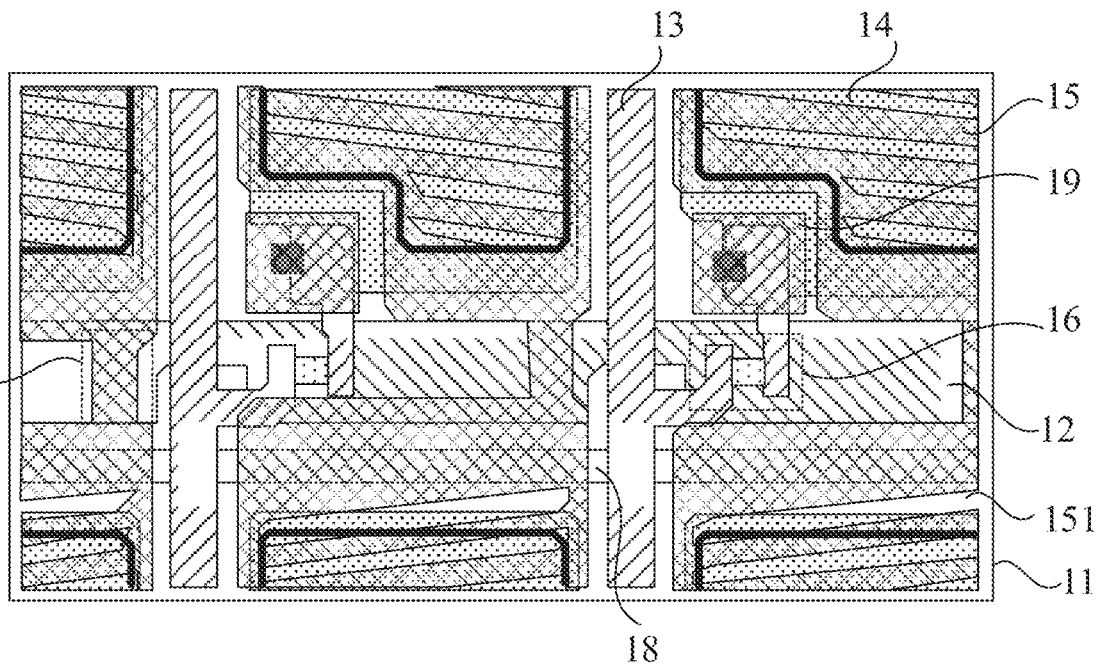
FIG. 8 is a local enlarged view of the array substrate shown in FIG. 7.
Figure 9:
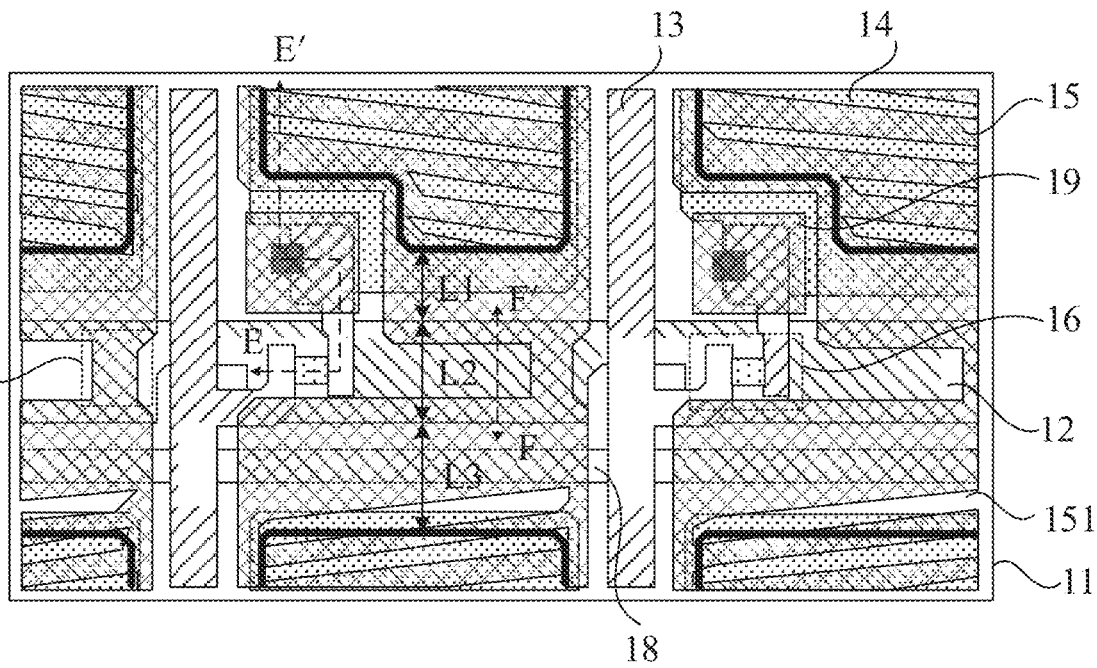
FIG. 9 is another local enlarged view of the array substrate shown in FIG. 7.

In some examples, as shown in FIGS. 7 to 9, an orthographic projection of at least one common electrode 15 on the base substrate 11 at least partially overlaps with an orthographic projection of at least one gate line 12 adjacent to the at least one common electrode 15 on the base substrate 11 (as shown in FIGS. 7 and 9), or a border of an orthographic projection of at least one common electrode 15 on the base substrate 11 partially overlaps with a border of an orthographic projection of at least one gate line 12 adjacent to the at least one common electrode 15 on the base substrate 11 (as shown in FIG. 8).

Here, a gate line 12 adjacent to each common electrode 15 is the same as a gate line 12 adjacent to a thin film transistor 16 in the same sub-pixel region P.

For example, the thin film transistor 16 in each sub-pixel region P is adjacent to two gate lines 12, that is, each common electrode 15 is adjacent to the two gate lines 12. In this case, the orthographic projection of the at least one common electrode 15 on the base substrate 11 at least partially overlaps with an orthographic projection of one gate line 12 in the two gate lines 12 on the base substrate 11, or the border of the orthographic projection of the at least one common electrode 15 on the base substrate 11 partially overlaps with a border of an orthographic projection of one gate line 12 in the two gate lines 12 on the base substrate 11, or the orthographic projection of the at least one common electrode 15 on the base substrate 11 at least partially overlaps with orthographic projections of the two gate lines 12 on the base substrate 11, or the orthographic projection of the at least one common electrode 15 on the base substrate 11 partially overlaps with borders of orthographic projections of the two gate lines 12 on the base substrate 11.

For example, the thin film transistor 16 in each sub-pixel region P is adjacent to a gate line 12, that is each common electrode 15 is adjacent to the gate line 12. In this case, the orthographic projection of the at least one common electrode 15 on the base substrate 11 at least partially overlaps with an orthographic projection of the gate line 12 on the base substrate 11, or the border of the orthographic projection of the at least one common electrode 15 on the base substrate 11 partially overlaps with a border of an orthographic projection of the gate line 12 on the base substrate 11.

Figure 10:
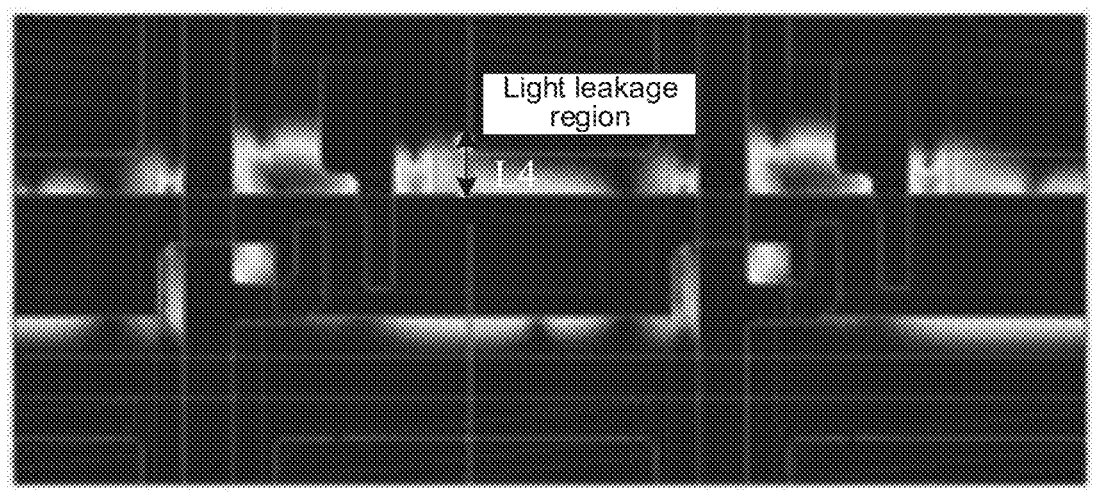
FIG. 10 is a schematic diagram of light leakage regions between a gate line and a common electrode adjacent to the gate line and between the gate line and a pixel electrode adjacent to the gate linein a case where the structure shown in FIG. 9 is applied into a display device being in a dark state.

In some examples, after the array substrate 100 is applied into the liquid crystal display device, as shown in FIG. 10, when the display state of the liquid crystal display device is a dark state, there is an off voltage on the gate line 12 (as the thin film transistor 16 is turned off) and there is no voltage on the pixel electrode 14 and the common electrode 15. Therefore, in a case where an electric field is generated between the gate line 12 and the pixel electrode 14 or the common electrode 15, the common electrode 4 may be used to shield the electric field as far as possible on a side of the common electrode 4 proximate to the base substrate 11, thereby reducing or even avoiding rotation of the liquid crystal molecules on a side of the common electrode 4 away from the base substrate 11 due to the electric field. In this way, compared with a case where the common electrode 15' is disposed on a side of the pixel electrode 14' proximate to the base substrate 11' (as shown in FIG. 2, the common electrode 15' cannot be used to shield the electric field), a dimension of the light leakage region (i.e., a dimension of the light leakage region in a direction perpendicular to the first direction) may be effectively reduced, thereby effectively reducing a size of the black matrix in the liquid crystal display device and increasing an aperture ratio of the liquid crystal display device.

For example, as shown in FIGS. 1 and 2, the black bold lines in FIG. 1 represent borders of an orthographic projection of the black matrix on the base substrate 11'. In the array substrate 100' in the related art, a dimension L4' of the light leakage region is 13 µm, a dimension L2' of the gate line 12' (i.e., a dimension of the gate line 12' in the direction perpendicular to the first direction) is 15 µm, and an alignment accuracy of the black matrix and the array substrate 100' is 5 µm. In this case, both distances L1' and L3' between the borders and the gate line 12' are a sum of the dimension of the light leakage region and the alignment accuracy. For example, if L1' is equal to L3', a dimension of the black matrix (i.e., a dimension of the black matrix in the direction perpendicular to the first direction) is 51 µm (a sum of 13 µm, 5 µm, 15 µm, 13 µm and 5 µm, i.e., 13 µm+5 µm+15 µm+13 µm+5 µm).

In the array substrate 100 provided by the embodiments of the present disclosure, as shown in FIGS. 9 and 10, the black bold lines in FIG. 9 represent borders of an orthographic projection of the black matrix on the base substrate 11. After the common electrode 15 is used to shield the electric field, the dimension L4 of the light leakage region may be reduced to 7 µm. If a dimension L2 of the gate line 12 is 15 µm, and an alignment accuracy of the black matrix and the array substrate 100 is 5 µm, both distances L1 and L3 between the borders and the gate line 12 are a sum of a dimension of the light leakage region and the alignment accuracy. For example, if L1 is equal to L3, a dimension of the black matrix may be reduced to 45 µm (a sum of 7 µm, 5 µm, 15 µm, 7 µm and 5 µm, i.e., 7 µm+5 µm+15 µm+7 µm+5 µm). Thus, the aperture ratio of the array substrate 100 provided by the embodiments of the present disclosure may be increased by approximately 4%.

Therefore, in the array substrate 100 provided by the embodiments of the present disclosure, by providing the common electrode 15 on the side of the pixel electrode 14 away from the base substrate 11, and making the orthographic projection of the at least one common electrode 15 on the base substrate 11 at least partially overlap with the orthographic projection of the at least one gate line 12 adjacent to the at least one common electrode 15 on the base substrate 11 or making the border of the orthographic projection of the at least one common electrode 15 on the base substrate 11 partially overlap with the border of the orthographic projection of the at least one gate line 12 adjacent to the at least one common electrode 15 on the base substrate 11, not only may an area of an effective electric field in each sub-pixel region P be increased effectively in the case where the thin film transistor 16 is turned on, but also the electric field may be shielded by using the the common electrode 15 in a case where the thin film transistor 16 is turned off. In this way, after the array substrate 100 is applied into the liquid crystal display device, in a case where the display state of the liquid crystal display device is the bright state, a rotation state of liquid crystal molecules at an edge of each sub-pixel region P may be effectively improved, an area of a dark field region of each sub-pixel region P may be reduced, and a transmittance of each sub-pixel region P may be increased, and the transmittance of the liquid crystal display device is further increased. In the case where the display state of the liquid crystal display device is the dark state, the size of the light leakage region may be effectively reduced, the size of the black matrix may be reduced, and the aperture ratio of the liquid crystal display device may be increased.

In some embodiments, as shown in FIG. 5, at least one gate line 12 is provided at opposite ends of each common electrode 15 respectively. The orthographic projection of the at least one common electrode 15 on the base substrate 11 at least partially overlaps with orthographic projections of gate lines 12 adjacent to opposite ends of the at least one common electrode 15 on the base substrate 11, or the border of the orthographic projection of the at least one common electrode 15 on the base substrate 11 partially overlaps with borders of orthographic projections of gate lines 12 adjacent to opposite ends of the at least one common electrode 15 on the base substrate 11.

For example, as shown in FIG. 5, one gate line 12 is provided at opposite ends of each common electrode 15 respectively. In this way, the orthographic projection of the at least one common electrode 15 on the base substrate 11 at least partially overlaps with orthographic projections of two gate lines 12 adjacent to the opposite ends of the at least one common electrode 15 on the base substrate 11, or the border of the orthographic projection of the at least one common electrode 15 on the base substrate 11 partially overlaps with borders of orthographic projections of two gate lines 12 adjacent to opposite ends of the at least one common electrode 15 on the base substrate 11, so that the at least one common electrode 15 can be used to shield electric fields at the opposite ends of the at least one common electrode 15. Therefore, after the array substrate 100 is applied into the liquid crystal display device, in the case where the display state of the liquid crystal display device is the dark state, the sizes of the light leakage regions at the opposite ends of the at least one common electrode 15 may be effectively reduced, the size of the black matrix may further be reduced, and the aperture ratio of the liquid crystal display device may be increased.

Of course, in a case where the structure of the thin film transistor 16 is a double-gate structure, two gate lines 12 may be provided at opposite ends of each common electrode 15 respectively, so that the orthographic projection of at least one common electrode 15 on the base substrate 11 at least partially overlaps with orthographic projections of at least two gate lines 12 (the at least two gate lines 12 are located at the opposite ends of the common electrode 15) on the base substrate 11, or the border of the orthographic projection of at least one electrode 5 on the base substrate 11 partially overlaps with borders of orthographic projections of at least two gate lines 12 (the at least two gate lines 12 are located at the opposite ends of the common electrode 15) on the base substrate 11. Beneficial effects that may be achieved in this example are the same as the beneficial effects that may be achieved when one gate line 12 is provided at the opposite ends of each common electrode 15 respectively, which will not be repeated herein.

In some embodiments, in the direction perpendicular to the first direction, a ratio of a dimension of each overlapping region to a dimension of a gate line 12 forming the overlapping region is in a range from 1:3 to 1:1. Here, a dimension of each gate line 12 can be selectively set according to actual needs. This embodiment provides an example in which the dimension of each gate line 12 is 15 µm, and in this case, the dimension of each overlapping region may be in a range from 5 µm to 15 µm. For example, the dimension of each overlapping region may be 5 µm, 8 µm, 11 µm, 13 µm or 15 µm.

In some examples, in the direction perpendicular to the first direction, dimensions of overlapping regions of the orthographic projection of the at least one common electrode 15 on the base substrate 11 and the orthographic projections of the gate lines 12 adjacent to the opposite ends of the at least one common electrode 15 on the base substrate 11 are the same. For example, dimensions of overlapping regions of an orthographic projection of a common electrode 15 on the base substrate 11 and orthographic projections of gate lines 12 adjacent to opposite ends of the common electrode 15 on the base substrate 11 may both be 5 µm, 6 µm or 7 µm, etc.

In some embodiments, as shown in FIGS. 5 and 6, in the first direction, a ratio of a distance LCD between the orthographic projection of the at least one common electrode 15 on the base substrate 11 and an orthographic projection of at least one data line 13 adjacent to the at least one common electrode 15 on the base substrate 11 to a dimension of the at least one data line 13 is in a range from 3:10 to 1:1. Here, a dimension of each data line 13 can be selectively set according to actual needs. For example, the dimension of each data line 13 may be 5 µm to 10 µm, in this case, a value range of $L_{CD}$ may be 3 µm to 5 µm. For example, $L_{CD}$ may be 3 µm, 3.5 µm, 4 µm, 4.7 µm or 5 µm.

In some embodiments, as shown in FIGS. 5 and 6, in the first direction, a ratio of a distance $L_{PD}$ between an orthographic projection of at least one pixel electrode 14 on the base substrate 11 and an orthographic projection of at least one data line 13 adjacent to the at least one pixel electrode 14 on the base substrate 11 to a dimension of the at least one data line 13 is in a range from 3:10 to 1:1. For example, the dimension of each data line 13 may be 5 µm to 10 µm, in this case, a value range of $L_{PD}$ may be 3 µm to 5 µm. For example, $L_{PD}$ may be 3 µm, 3.6 µm, 4 µm, 4.6 µm or 5 µm.

In the first direction, by providing the distance $L_{CD}$ between the orthographic projection of the at least one common electrode 15 on the base substrate 11 and the orthographic projection of the at least one data line 13 adjacent to the at least one common electrode 15 on the base substrate 11, and the distance $L_{PD}$ between the orthographic projection of the at least one pixel electrode 14 on the base substrate 11 and the orthographic projection of the at least one data line 13 adjacent to the at least one pixel electrode 14 on the base substrate 11, not only may it be ensured that the electric field between the pixel electrode 14 and the common electrode 15 and the electric field between the common electrode 15 and the data line 13 meet use requirements, but also $L_{CD}$ and $L_{PD}$ may be made as small as possible, thereby effectively increasing the area of the effective electric field in each sub-pixel region P and improving the transmittance of the liquid crystal display device to which the array substrate 100 is applied.

In some embodiments, in the first direction, a magnitude relationship between the distance $L_{CD}$ between the orthographic projection of the at least one common electrode 15 on the base substrate 11 and the orthographic projection of the at least one data line 13 adjacent to the at least one common electrode 15 on the base substrate 11, and the distance $L_{PD}$ between the orthographic projection of the at least one pixel electrode 14 on the base substrate 11 and the orthographic projection of the at least one data line 13 adjacent to the at least one pixel electrode 14 on the base substrate 11 can be selectively set according to actual needs.

In some examples, in the first direction, the distance $L_{PD}$ between the orthographic projection of the at least one pixel electrode 14 on the base substrate 11 and the orthographic projection of the at least one data line 13 adjacent to the at least one pixel electrode 14 on the base substrate 11 is greater than the distance $L_{CD}$ between the orthographic projection of the at least one common electrode 15 on the base substrate 11 and the orthographic projection of the at least one data line 13 adjacent to the at least one common electrode 15 on the base substrate 11. For example, $L_{PD}$ is 5 µm, and $L_{CD}$ is 3.5 µm.

In some other examples, in the first direction, the distance $L_{PD}$ between the orthographic projection of the at least one pixel electrode 14 on the base substrate 11 and the orthographic projection of the at least one data line 13 adjacent to the at least one pixel electrode 14 on the base substrate 11 is less than the distance $L_{CD}$ between the orthographic projection of the at least one common electrode 15 on the base substrate 11 and the orthographic projection of the at least one data line 13 adjacent to the at least one common electrode 15 on the base substrate 11. For example, $L_{PD}$ is 3.5 µm, and $L_{CD}$ is 5 µm.

In some embodiments, as shown in FIGS. 7 to 9, the array substrate 100 further includes a plurality of connecting portions 17 disposed in a same layer as the plurality of common electrodes 15. Each connecting portion 17 and two common electrodes 15 adjacent to the connecting portion 17 are an integral structure.

The number of connecting portions 17 and arrangement positions thereof can be selectively set according to actual needs.

For example, the number of connecting portions 17 is the same as the number of common electrodes 15 in a row, the connecting portions 17 are arranged in a row in the first direction, and orthographic projections of the connecting portions 17 on the base substrate 11 partially overlaps with an orthographic projection of one gate line 12 of the plurality of gate lines 12 on the base substrate 11. In this case, in two adjacent rows of common electrodes 15, every two adjacent common electrodes 15 in the second direction are connected by a connecting portion 17, and are an integral structure.

For example, the number of connecting portions 17 is less than the number of common electrodes 15 in a row, the connecting portions 17 are arranged in a row in the first direction, and the orthographic projections of the connecting portions 17 on the base substrate 11 partially overlaps with an orthographic projection of a part of the plurality of data lines 13 on the base substrate 11. In this case, among a part of a row of common electrodes 15, two adjacent common electrodes 15 are connected by a connecting portion 17.

By arranging the connecting portions 17 and the plurality of common electrodes 15 in the same layer, it is beneficial to simplify a manufacturing process of the array substrate 100 and improve a manufacturing efficiency of the array substrate 100. By connecting each connecting portion 17 with two common electrodes 15 adjacent to the connecting portion 17, it is possible to provide a common voltage to the two connected common electrodes 15 simultaneously, or to stop providing a common voltage to the two connected common electrodes 15 simultaneously, which is beneficial to simplifying the arrangement structure of the array substrate 100.

In some examples, as shown in FIG. 7, the plurality of common electrodes 15 are arranged in a plurality of columns in the first direction, that is, in the plurality of columns of common electrodes 15, each column of common electrodes 15 extends in the second direction. Here, in at least one column of common electrodes 15, every two adjacent common electrodes 15 and a connecting portion 17 therebetween are an integral structure. That is, in one column of common electrodes 15, every two adjacent common electrodes 15 are connected together by a connecting portion 17 therebetween; or in each column common electrodes 15 of a plurality of columns of common electrodes 15, every two adjacent common electrodes 15 are connected together by a connecting portion 17 therebetween.

In a case where every two adjacent common electrodes 15 in each column of common electrodes 15 of the plurality of columns of common electrodes 15 are connected together by the connecting portion 17 therebetween, the plurality of columns of common electrodes 15 may be a plurality of columns of common electrodes 15 adjacent to each other, or a plurality of columns of common electrodes 15 spaced apart from each other (e.g., a third column, a sixth column, a ninth column, etc. shown in FIG. 7), which is not limited in the embodiments of the present disclosure.

By connecting every two adjacent common electrodes 15 in at least one column of common electrodes 15 with the connecting portion 17 therebetween, not only may the arrangement structure of the array substrate 100 be effectively simplified, but also an electric field shielding effect of the common electrode 15 may be effectively ensured.

In some embodiments, as shown in FIGS. 7 to 9, the array substrate 100 further includes a plurality of common electrode lines 18 extending in the first direction and disposed in the same layer as the plurality of gate lines 12. The plurality of common electrodes 15 are arranged in a plurality of rows in the second direction. Each common electrode line 18 is electrically connected to a plurality of common electrodes 15 in a row through a plurality of via holes (e.g., first via holes G1).

The number of common electrode lines 18 can be selectively set according to actual needs. For example, the number of common electrode lines 18 is the same as the number of rows of common electrodes 15, so that a plurality of common electrodes 15 in each row can be electrically connected to one common electrode line 18. In some examples, as shown in FIG. 7, each common electrode 15 may be electrically connected to a common electrode line 18 through a first via hole G1.

By arranging the plurality of common electrode lines 18 and the plurality of gate lines 12 in the same layer, it is beneficial to simplify the manufacturing process of the array substrate 100 and improve the manufacturing efficiency of the array substrate 100. The common electrode line 18 is configured to provide a common voltage for the common electrodes 15 electrically connected thereto. By electrically connecting each common electrode line 18 with the plurality of common electrodes 15 in a row, it is possible to individually provide a common voltage for each row of common electrodes 15, which is conductive to reducing energy consumption.

In some embodiments, a positional relationship between the thin film transistor 16 and the pixel electrode 14 in each sub-pixel region P includes various types, which is not limited in the embodiments of the present disclosure. Here, the positional relationship is related to an area of the sub-pixel region P.

In some examples, the sub-pixel region P has a small area. In this case, in each sub-pixel region P, a large electric field is required between the pixel electrode 14 and the common electrode 15, which means that a distance between the pixel electrode 14 and the common electrode 15 is small in a direction perpendicular to the base substrate 11.

As shown in FIG. 15, the thin film transistor 16 may be disposed on a side of the pixel electrode 14 proximate to the base substrate 11. In this way, the distance between the pixel electrode 14 and the common electrode 15 in the direction perpendicular to the base substrate 11 may be effectively reduced to ensure that an electric field generated between the pixel electrode 14 and the common electrode 15 is a required electric field in a case where appropriate voltages are provided for the pixel electrode 14 and the common electrode 15, respectively.

In this example, as shown in FIG. 15, the pixel electrode 14 may be electrically connected to the drain electrode 163 of the thin film transistor 16 through a second via hole G2.

In some other examples, the sub-pixel region P has a large area. In this case, compared with the sub-pixel region P with a small area, the electric field between the pixel electrode 14 and the common electrode 15 in each sub-pixel region P is small, which means that the distance between the pixel electrode 14 and the common electrode 15 is large in the direction perpendicular to the base substrate 11.

As shown in FIGS. 13 and 14, the thin film transistor 16 is disposed between the pixel electrode 14 and the common electrode 15 in the same sub-pixel region P. In this way, the distance between the pixel electrode 14 and the common electrode 15 in the direction perpendicular to the base substrate 11 may be increased by using the thin film transistor 16 to ensure that the electric field generated between the pixel electrode 14 and the common electrode 15 is a required electric field in the case where appropriate voltages are provided for the pixel electrode 14 and the common electrode 15, respectively.

In this example, the pixel electrode 14 may be electrically connected to the drain electrode 163 of the thin film transistor 16 in various ways.

For example, as shown in FIG. 13, the pixel electrode 14 is directly electrically connected to the drain electrode 163 of the thin film transistor 16 through a third via hole G3.

For example, as shown in FIG. 14, the array substrate 100 further includes a plurality of conductive patterns 19 disposed in the same layer as the plurality of common electrodes 15 and disposed in the plurality of sub-pixel regions P respectively. Each conductive pattern 19 is electrically connected to the drain electrode 163 (which may, of course, be the source electrode 162) of the thin film transistor 16 and the pixel electrode 14 that are in the same sub-pixel region P through a fourth via hole G4. That is, the drain electrode 163 of each thin film transistor 16 is electrically connected to the pixel electrode 14 through the conductive pattern 19. In this way, the first via hole G1 and the fourth via hole G4 may be formed by using one mask, which is beneficial to reducing the number of masks and reducing the cost of manufacturing the array substrate 100.

In some embodiments, as shown in FIGS. 7 to 9, each common electrode 15 has a plurality of slits 151, and an extending direction of at least a part of the plurality of slits 151 is parallel to or at an acute angle to the first direction. That is, an extending direction of a part of the plurality of slits 151 is parallel to or at an acute angle to the first direction, or an extending direction of all slits 151 of the plurality of slits 151 is parallel to or at an acute angle to the first direction.

By providing the slits 151 in the common electrode 15, a multi-dimensional electric field can be formed between the common electrode 15 and the pixel electrode 14. In a case where the array substrate 100 is applied into the liquid crystal display device, a large area of liquid crystal molecules in each sub-pixel region P may be rotated by using the multi-dimensional electric field, thereby increasing the transmittance of the liquid crystal display device.

An extending direction of each slit 151 can be selectively set according to actual needs.

In some examples, as shown in FIG. 7, each sub-pixel region P includes a first sub-region P1 and a second sub-region P2 adjacent to each other. Among the plurality of slits 151, some slits 151 located in the first sub-region P1 extend in a third direction, and other slits 151 located in the second sub-region P2 extend in a fourth direction. The third direction and the fourth direction are symmetrical with respect to the first direction. This means that the array substrate 100 in this example is an array substrate with a dual-domain structure. In this way, through a complementary effect of domains, gray scale inversion and color shift of the liquid crystal display device to which the array substrate 100 is applied may be suppressed to improve a viewing angle of the liquid crystal display device.

Of course, the array substrate 100 provided by the embodiments of the present disclosure may also be an array substrate with a three-domain structure or an array substrate with a four-domain structure, which is not limited in embodiments of the present disclosure.

Figure 16:
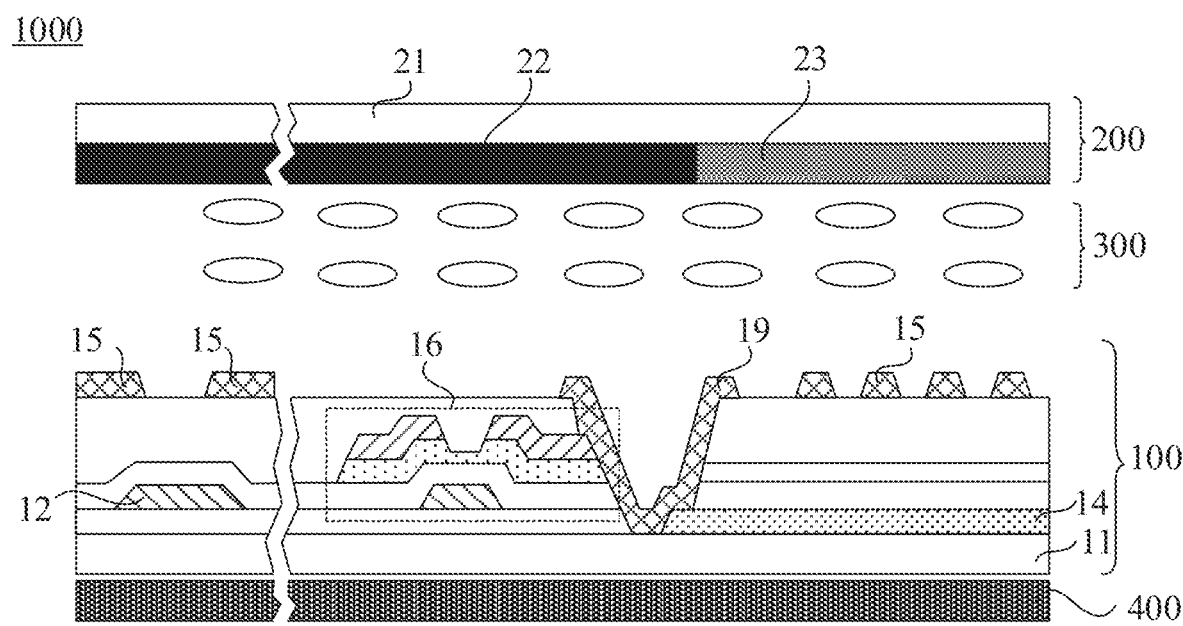
FIG. 16 is a structural diagram of a display device, in accordance with some embodiments of the present disclosure.

Some embodiments of the present disclosure provide a display device 1000, and the display device 1000 may be a liquid crystal display device. As shown in FIG. 16, the display device 1000 includes the array substrate 100 provided by some embodiments described above, an opposite substrate 200 disposed opposite to the array substrate 100, and a liquid crystal layer 300 disposed between the array substrate 100 and the opposite substrate 200.

In some examples, as shown in FIG. 16, the opposite substrate 200 includes an opposite base substrate 21, and a black matrix 22 disposed on a side of the opposite base substrate 21 proximate to the array substrate 100.

The black matrix 22 is configured to block light emitted to the gate line 12, the data line 13 and the thin film transistor 16 in the array substrate 100, and to block light leaked from the light leakage region. In this way, orthographic projections of the gate line 12, the data line 13, the thin film transistor 16 and the light leakage region on the base substrate 11 are located within an orthographic projection of the black matrix 22 on the base substrate 11, which is conductive to ensuring that the display device 1000 has a good display effect.

In some examples, as shown in FIG. 16, the opposite substrate 200 further includes a color filter layer 23 disposed on a side of the opposite base substrate 21 proximate to the array substrate 100. The color filter layer 23 includes a plurality of color filter portions, such as red color filter portions, blue color filter portions and green color filter portions.

There are various types of liquid crystal molecules in the liquid crystal layer 300. For example, the liquid crystal molecules are positive liquid crystal molecules, or the liquid crystal molecules are negative liquid crystal molecules.

The array substrate 100 included in the above display device 1000 has the same structure and beneficial effects as the array substrate 100 provided in some embodiments described above. Since the structure and the beneficial effects of the array substrate 100 have been described in detail in some embodiments described above, which will not be repeated herein.

In some embodiments, as shown in FIG. 16, the display device 1000 further includes a backlight module 400 disposed on a side of the array substrate 100 away from the opposite substrate 200. The backlight module 400 is configured to provide light.

Here, the backlight module 400 includes, but is not limited to, a backlight source.

There are various types of backlight modules 400. For example, the backlight module 400 is a direct-lit backlight module, and in this case, the backlight module 400 further includes a diffusion plate and optical films, etc. For example, the backlight module 400 is an edge-lit backlight module, and in this case, the backlight module 400 further includes a light guide plate and a diffusion sheet, etc.

In some embodiments, the display device 1000 may be any device that displays images whether moving (e.g., videos) or stationary (e.g, still images), and whether textual or graphical. More specifically, it is contemplated that the embodiments can be implemented in or associated with a variety of electronic devices, such as (but not limited to) mobile phones, wireless devices, personal digital assistants (PDAs), handheld or portable computers, global positioning system (GPS) receivers/navigators, cameras, moving picture experts group 4 (MP4) video players, camcorders, game consoles, watches, clocks, calculators, TV monitors, flat panel displays, computer monitors, automobile displays (e.g., odometer displays, etc.), navigators, cockpit controllers and/or displays, displays of camera views (e.g., displays of rear-view cameras in vehicles), electronic photographs, electronic billboards or signs, projectors, architectural structures, packaging and aesthetic structures (e.g., displays for displaying images of a piece of jewelry), etc.

The above descriptions are merely specific implementations of the present disclosure, but the protection scope of the present disclosure is not limited thereto. Any changes or replacements those skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate having a plurality of sub-pixel regions, the array substrate comprising:
   a base substrate;
   a plurality of gate lines disposed on a side of the base substrate and extending in a first direction;
   a plurality of data lines disposed on the side of the base substrate and extending in a second direction, the plurality of data lines and the plurality of gate lines crossing and being insulated from each other;
   a plurality of pixel electrodes, each of the plurality of pixel electrodes being disposed in a respective one of the plurality of sub-pixel regions; and
   a plurality of common electrodes disposed on a side, facing away from the base substrate, of the plurality of pixel electrodes and the plurality of gate lines;
   wherein an orthographic projection of at least one common electrode on the base substrate at least partially overlaps with an orthographic projection of at least one gate line adjacent to the at least one common electrode on the base substrate, or a border of an orthographic projection of at least one common electrode on the base substrate partially overlaps with a border of an orthographic projection of at least one gate line adjacent to the at least one common electrode on the base substrate; and in the first direction, a ratio of a distance between the orthographic projection of the at least one common electrode on the base substrate and an orthographic projection of at least one data line adjacent to the at least one common electrode on the base substrate to a dimension of the at least one data line is in a range from 3:10 to 1:1.

2. The array substrate according to claim 1, wherein at least one gate line is provided at each of opposite ends of each common electrode; and the orthographic projection of the at least one common electrode on the base substrate at least partially overlaps with orthographic projections of gate lines adjacent to opposite ends of the at least one common electrode on the base substrate, or the border of the orthographic projection of the at least one common electrode on the base substrate partially overlaps with borders of orthographic projections of gate lines adjacent to opposite ends of the at least one common electrode on the base substrate.

3. The array substrate according to claim 1, wherein in a direction perpendicular to the first direction, a ratio of a dimension of each overlapping region to a dimension of a gate line forming the overlapping region is in a range from 1:3 to 1:1, the overlapping region is a region where the orthographic projection of the at least one common electrode on the base substrate and an orthographic projection of the gate line adjacent to the at least one common electrode on the base substrate overlap.

4. The array substrate according to claim 2, wherein in a direction perpendicular to the first direction, dimensions of overlapping regions of the orthographic projection of the at least one common electrode on the base substrate and the orthographic projections of the gate lines adjacent to the opposite ends of the at least one common electrode on the base substrate are same.

5. The array substrate according to claim 1, wherein in the first direction, a ratio of a distance between an orthographic projection of at least one pixel electrode on the base substrate and an orthographic projection of at least one data line adjacent to the at least one pixel electrode on the base substrate to a dimension of the at least one data line is in a range from 3:10 to 1:1.

6. The array substrate according to claim 5, wherein in the first direction, the distance between the orthographic projection of the at least one pixel electrode on the base substrate and the orthographic projection of the at least one data line adjacent to the at least one pixel electrode on the base substrate is greater than the distance between the orthographic projection of the at least one common electrode on the base substrate and the orthographic projection of the at least one data line adjacent to the at least one common electrode on the base substrate.

7. The array substrate according to claim 1, further comprising:

a plurality of connecting portions disposed in a same layer as the plurality of common electrodes, wherein each connecting portion and two common electrodes adjacent to the connecting portion are an integral structure.

8. The array substrate according to claim 7, wherein the plurality of common electrodes are arranged in a plurality of columns in the first direction; and in at least one column of common electrodes, every two adjacent common electrodes and a connecting portion therebetween are an integral structure.

9. The array substrate according to claim 1, further comprising:

a plurality of common electrode lines extending in the first direction and disposed in a same layer as the plurality of gate lines;

wherein the plurality of common electrodes are arranged in a plurality of rows in the second direction; and each common electrode line is electrically connected to a plurality of common electrodes in a row through a plurality of via holes.

10. The array substrate according to claim 1, further comprising: a thin film transistor disposed on a side of each pixel electrode facing the base substrate, wherein the thin film transistor includes a gate electrode, a source electrode and a drain electrode, wherein the gate electrode and a gate line adjacent to the gate electrode are disposed in a same layer and electrically connected to each other;

the pixel electrode is electrically connected to the source electrode or the drain electrode;

the array substrate further comprises a plurality of data lines, the source electrode, the drain electrode and the plurality of data lines are disposed in a same layer.

11. The array substrate according to claim 1, further comprising:

a thin film transistor disposed in each sub-pixel region and located between a pixel electrode and a common electrode in the sub-pixel region, wherein the thin film transistor includes a gate electrode, a source electrode and a drain electrode, wherein the gate electrode and a gate line adjacent to the gate electrode are disposed in a same layer and electrically connected to each other;

the pixel electrode is electrically connected to the source electrode or the drain electrode; and the array substrate further comprises a plurality of data lines, the plurality of data lines, the source electrode and the drain electrode are disposed in a same layer.

12. The array substrate according to claim 11, further comprising:

a plurality of conductive patterns disposed in a same layer as the plurality of common electrodes, each of the conductive patterns being disposed in a respective one of the plurality of sub-pixel regions, wherein each conductive pattern is electrically connected to a source electrode or a drain electrode of a thin film transistor in a same sub-pixel region as the conductive pattern, and is electrically connected to a pixel electrode in the same sub-pixel region as the conductive pattern.

13. The array substrate according to claim 1, wherein each common electrode has a plurality of slits, and an extending direction of at least a part of the plurality of slits is parallel to or at an acute angle to the first direction.

14. The array substrate according to claim 13, wherein each sub-pixel region includes a first sub-region and a second sub-region that are adjacent to each other;

among the plurality of slits, slits located in the first sub-region extend in a third direction, and slits located in the second sub-region extend in a fourth direction; and the third direction and the fourth direction are symmetrical with respect to the first direction.

15. A display device, comprising:
the array substrate according to claim 1;
an opposite substrate disposed opposite to the array substrate; and
a liquid crystal layer disposed between the array substrate and the opposite substrate.

16. The display device according to claim 15, wherein the opposite substrate includes:
an opposite base substrate; and
a black matrix disposed on a side of the opposite base substrate facing the array substrate.

* * * * *